(12) United States Patent
Nisar et al.

(10) Patent No.: US 11,802,088 B1
(45) Date of Patent: Oct. 31, 2023

(54) HIGH-ENTROPY ULTRA-HIGH TEMPERATURE CERAMIC (HE-UHTC) COATINGS AND DEPOSITION METHODS THEREOF

(71) Applicants: Ambreen Nisar, Miami, FL (US); Arvind Agarwal, Miami, FL (US); Cheng Zhang, Miami, FL (US)

(72) Inventors: Ambreen Nisar, Miami, FL (US); Arvind Agarwal, Miami, FL (US); Cheng Zhang, Miami, FL (US)

(73) Assignee: THE FLORIDA INTERNATIONAL UNIVERSITY BOARD OF TRUSTEES, Miami, FL (US)

( * ) Notice: Subject to any disclaimer, the term of this patent is extended or adjusted under 35 U.S.C. 154(b) by 0 days.

(21) Appl. No.: 17/842,330

(22) Filed: Jun. 16, 2022

(51) Int. Cl.
  *C04B 35/56* (2006.01)
  *C04B 35/626* (2006.01)
  *C04B 35/64* (2006.01)

(52) U.S. Cl.
  CPC ...... *C04B 35/5622* (2013.01); *C04B 35/5611* (2013.01); *C04B 35/6261* (2013.01); *C04B 35/64* (2013.01); *C04B 2235/3843* (2013.01); *C04B 2235/666* (2013.01)

(58) Field of Classification Search
  CPC ............. C04B 35/5622; C04B 35/5611; C04B 35/6261; C04B 35/64; C04B 2235/3843; C04B 2235/666
  USPC ........................................................ 428/688
  See application file for complete search history.

(56) References Cited

FOREIGN PATENT DOCUMENTS

| CN | 111254379 A | * | 6/2020 | ............. C22C 14/00 |
| CN | 112490442 A | * | 3/2021 | |

OTHER PUBLICATIONS

Translation of CN 111254379, Jun. 9, 2020. (Year: 2020).*
Translation of CN 112490442, Mar. 12, 2021. (Year: 2021).*

* cited by examiner

*Primary Examiner* — Hui H Chin
(74) *Attorney, Agent, or Firm* — Saliwanchik, Lloyd & Eisenschenk

(57) ABSTRACT

High-entropy ultra-high temperature ceramics (HE-UHTC) coatings deposited on substrates, as well methods for depositing the HE-UHTC coatings on the substrates, are provided. An HE-UHTC electrode can be fabricated via spark plasma sintering (SPS) and then a thin coating of the HE-UHTC can be deposited in a precision-controlled manner on a substrate via an electro-spark deposition process.

19 Claims, 12 Drawing Sheets

HIGH-ENTROPY ULTRA-HIGH TEMPERATURE CERAMIC (HE-UHTC) COATINGS AND DEPOSITION METHODS THEREOF

BACKGROUND

Ultra-high temperature ceramics (UHTCs) with melting points of greater than 3,000° C. are known for their intriguing combination of metal-like properties and ceramic-like properties, offering excellent stability at temperatures above 2,500° C. These materials are also recognized as potential materials for thermal protection systems (TPSs) owing to properties that are beyond the capabilities of other structural materials. A new class of UHTCs, referred as high-entropy UHTCs (HE-UHTCs) has gained interest due to the remarkable improvement in their thermo-mechanical properties over ordinary UHTCs.

BRIEF SUMMARY

Embodiments of the subject invention provide novel and advantageous high-entropy ultra-high temperature ceramics (HE-UHTC) coatings deposited on substrates, as well methods for depositing the HE-UHTC coatings on the substrates. An HE-UHTC electrode can be fabricated via spark plasma sintering (SPS) and then a thin (e.g., less than 100 micrometers (μm)) coating of the HE-UHTC can be deposited in a precision-controlled manner on a substrate (e.g., an electrically conductive substrate) via an electro-spark deposition process. The HE-UHTC coating provides thermal and wear protection for the substrate on which it is deposited. The substrate can be, for example, steel, graphite, carbide (e.g., silicon carbide (SiC) such as carbon/SiC (C/SiC)), titanium (Ti), Ti alloy, a nickel (Ni) substrate (e.g., a Ni-based alloy or superalloy, such as an austenitic nickel-chromium-based superalloy), or a carbon/carbon (C/C) composite.

In an embodiment, a method for fabricating a coating of a ceramic material on a substrate can comprise: performing an SPS process on a powder of the ceramic material to give an electrode; and depositing the coating of the ceramic material on (e.g., directly on and in physical contact with) the substrate by performing an electro-spark deposition process using the electrode. The ceramic material can be an HE-UHTC (e.g., (TaNbHfTi)C) or an intermetallic carbide (e.g., MAX®). The substrate can be an electrically conductive substrate (e.g., steel, graphite, a nickel-based alloy (e.g., INCONEL®), or a titanium-based alloy). The method can further comprise, before performing the SPS process on the powder of the ceramic material, preparing the powder of the ceramic material by ball-milling raw powders of a plurality of ceramic components. Each ceramic component of the plurality of ceramic components can be an ultra-high temperature ceramic (UHTC), and the preparing of the powder of the ceramic material can comprise ball-milling the raw powders such that the powder of the ceramic material comprises an equimolar composition of the UHTCs (e.g., HfC, TiC, and (TaNb)C). The depositing of the coating of the ceramic material can comprise precision controllable, automated, layer-by-layer deposition of the ceramic material. The coating of the ceramic material on the substrate can have a thickness in a range of, for example, from 0.1 μm to 30 μm. The substrate can be such that no pre-treatment was performed thereon before the depositing of the coating of the ceramic material on the substrate. The coating of the ceramic material on the substrate can comprise no oxidation or phase transformation. The coating of the ceramic material on the substrate can be thermally stable up to a temperature of at least 2,500° C.

In another embodiment, a compound can comprise: an electrically conductive substrate; and a coating of an HE-UHTC (e.g., (TaNbHfTi)C) disposed directly on and in physical contact with the substrate. The substrate can be, for example, steel, graphite, a nickel-based alloy, or a titanium-based alloy. The HE-UHTC comprising an equimolar composition of at least two UHTCs (e.g., HfC, TiC, and (TaNb)C). The coating of the HE-UHTC can have a thickness in a range of, for example, from 0.1 μm to 30 μm. The coating of the HE-UHTC can comprise no oxidation or phase transformation. The coating of the HE-UHTC can be thermally stable up to a temperature of at least 2,500° C.

DETAILED DESCRIPTION

Figure 1A:
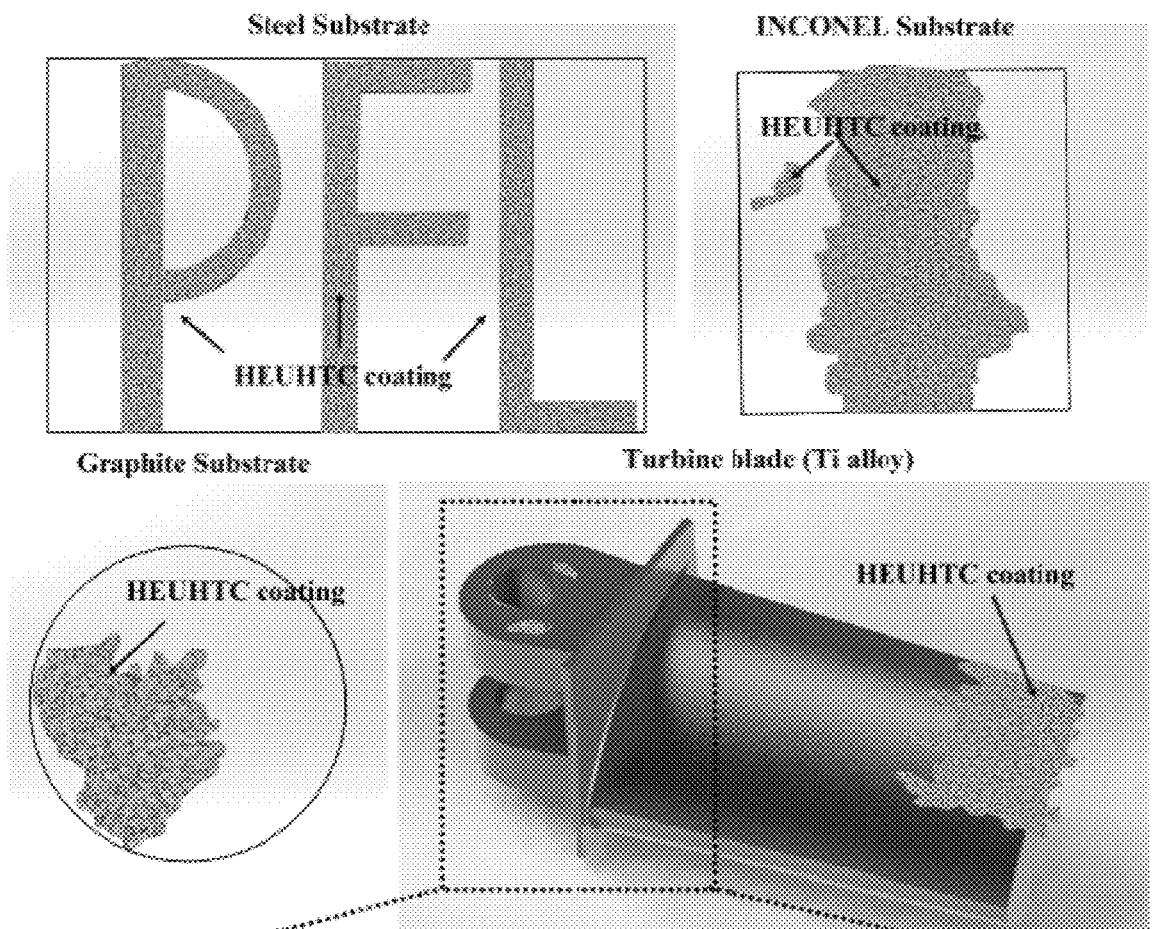
FIG. 1(a) shows images of high-entropy ultra-high temperature ceramic (HE-UHTC) coatings on different substrates (clockwise from top-left: steel; INCONEL® (austenitic nickel-chromium-based superalloy); titanium (Ti) alloy; and graphite). The scale bars are, clockwise from top-left, 5 millimeters (mm), 5 mm, 10 mm, and 5 mm.

Embodiments of the subject invention provide novel and advantageous high-entropy ultra-high temperature ceramics (HE-UHTC) coatings deposited on substrates, as well methods for depositing the HE-UHTC coatings on the substrates. An HE-UHTC electrode can be fabricated via spark plasma sintering (SPS) and then a thin (e.g., less than 100 micrometers (μm)) coating of the HE-UHTC can be deposited in a precision-controlled manner on a substrate (e.g., an electrically conductive substrate) via an electro-spark deposition process. The HE-UHTC coating provides thermal and wear protection for the substrate on which it is deposited. The substrate can be, for example, steel, graphite, carbide (e.g., silicon carbide (SiC) such as carbon/SiC (C/SiC)), titanium (Ti), Ti alloy, a nickel (Ni) substrate (e.g., a Ni-based alloy or superalloy, such as an austenitic nickel-chromium-based superalloy), or a carbon/carbon (C/C) composite.

HE-UHTCs are typically made from a combination of a plurality (e.g., two, three, four, five, or six, or more) of UHTCs in equimolar composition. Due to mutual solubility, a complete solid-solution single-phase is formed as the HE-UHTC. HE-UHTCs possess exceptionally superior mechanical, oxidation, and erosion resistance as compared to conventional UHTCs. No related art technology exists for depositing HE-UHTC coatings on a substrate (e.g., to thermally protect a structure).

The related art focuses on processing and characterizing bulk HE-UHTC. However, the use of bulk ceramics in large and hot structures such as wing edges and nose cones is limited due to the intrinsic brittleness and high density of these materials. Embodiments of the subjection invention make innovative applications of HE-UHTCs (e.g., HE-UHTC coatings) possible. Preparation of HE-UHTC coatings on fiber-reinforced composites (C/C, C/SiC), graphite, and Ni-based superalloys used for manufacturing critical components (e.g., for gas turbine engines and/or shipboard propulsion units) is a logical choice for improving the oxidation and ablation resistance in high temperature and oxygen contained environments. HE-UHTC coatings over can translate into enormous savings of dollars per pound (e.g., of payload-to-orbit for rockets).

Related art coating methods for conventional UHTCs have a low content of UHTC phases, high oxide content, and weak bonding with the substrate (see also, e.g.; Shirani et al., $ZrB_2$—SiC—WC coating with SiC diffusion bond coat on graphite by spark plasma sintering process, Ceramics International, 43, 14517-14520, 2017; which is hereby incorporated by reference herein in its entirety). Processing methods for depositing coatings include sputter deposition, electroplating, electron beam irradiation, liquid precursor method, slurry coating, pack cementation, and chemical vapor deposition (CVD). In particular, pack cementation, CVD, plasma spray, and slurry sintering can be used to deposit UHTC coatings. However, no related art technology exist to deposit HE-UHTC coatings. The key issues with ceramic coatings on substrates (e.g., C/C composites, graphite, Ti-based alloys) are adherence, continuity, and phase transformation (oxide phase formation) to resist delamination during extreme thermal excursions. No process exists in the related art to overcome these challenges to be able to deposit HE-UHTC coatings on a substrate. Processes of embodiments of the subject invention overcome these challenges while being simple so that coatings can be made reproducibly and reliably on various substrates (e.g., graphite, Ti, INCONEL® (austenitic nickel-chromium-based superalloy), and steel). A simple electro-spark deposition process can be used.

Figures 7A, 7B:
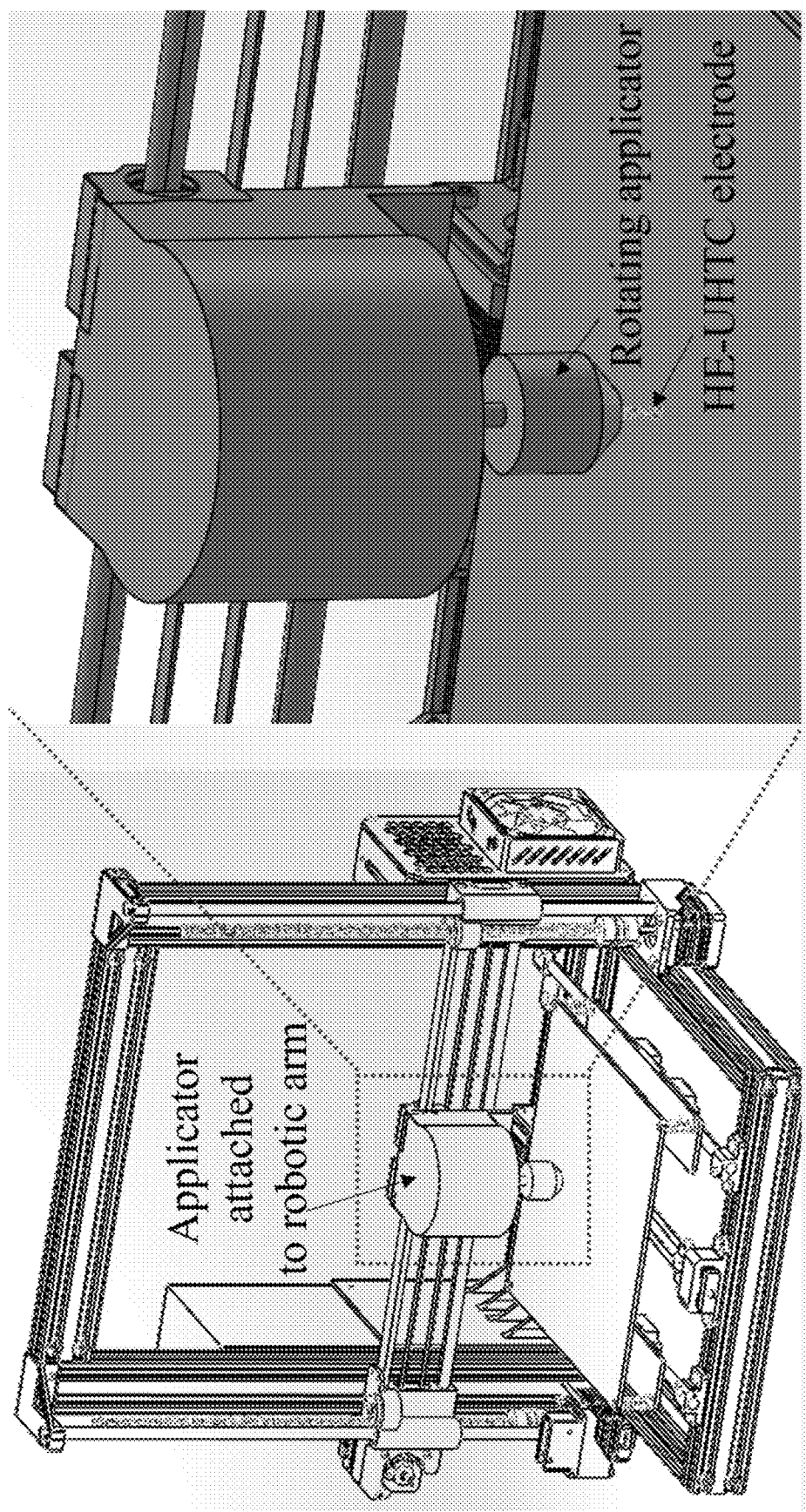
FIG. 7(a) shows an image of a precision controllable automated electro-spark applicator for depositing HE-UHTC coatings, according to an embodiment of the subject invention.
FIG. 7(b) shows an enlarged version of a portion of the electro-spark applicator from FIG. 7(a) (see the arrow in FIG. 7(a)), depicting a rotating applicator and an HE-UHTC electrode.

Embodiments of the subject invention provide HE-UHTC coatings to protect structural components from thermal and wear degradation. An HE-UHTC electrode can be fabricated via SPS, and then thin (e.g., less than 100 μm) HE-UHTC coatings can be deposited on an electrically conductive substrate via an electro-spark deposition process. The deposition can be performed in a precision-controlled matter. FIGS. 7(a) and 7(b) show images of a precision controllable automated electro-spark applicator that can be used for the electro-spark deposition process.

In an embodiment, electrode preparation can comprise mixing (e.g., mixing by ball-milling) powders (e.g., raw powders) of the components of the HE-UHTC (e.g., tantalum (Ta), niobium (Nb), hafnium (Hf), and/or Ti, in a carbide (e.g., (Ta,Nb,Hf,Ti)C)) or other coating material (e.g., MAX® carbide (e.g., TiAlC or Ti$_2$AlC)). After mixing the powders, SPS can be performed on the mixed powders to form the electrode. A deposition machine, such as a portable electro-spark deposition device (see FIGS. 7(a) and 7(b)) can be used for depositing the coating on an electrically conductive substrate using the prepared electrode in an electro-spark deposition process. If the prepared electrode is an HE-UHTC electrode, the coating will be an HE-UHTC coating. The coating can be an ultra-thin, lightweight HE-UHTC (or other coating material) coating (e.g., a carbide coating) to increase oxidation resistance and extend the service life of critical components made of materials such as heat-resistant metallic alloys and/or graphite.

The deposition processes of embodiments of the subject invention are applicable to not just HE-UHTCs but also any other electrically conductive ceramics including monolithic UHTCs (and any electrically conductive substrate). For example, intermetallic carbide (MAX® phase Ti$_2$AlC) coatings can also be deposited to provide long-term high-temperature strength and resistance to oxidizing gas fluxes for critical structural components of gas turbine engines, propulsion units, and other substrates (e.g., graphite, C/C, and C/SiC substrates).

The thickness of the deposited coating can be, for example, any of the following values, about any of the following values, at most any of the following values, at least any of the following values, or within a range having any of the following values as endpoints (all values are in μm): 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 45, 50, 55, 60, 65, 70, 75, 80, 85, 90, 95, 100, 110, 120, 130, 140, 150, 160, 170, 180, 190, 200, 225, 250, 275, 300, 350, 400, 450, or 500. For example, the thickness of the deposited coating can be less than 100 μm, such as from 0.1 μm to 30 μm (e.g., about 25 μm).

Embodiments of the subject invention provide ultra-thin, light-weight HE-UHTC and other carbide coatings on various substrates, including but not limited to graphite, metal, and alloys (e.g., steel, Ti alloys, and nickel alloys (e.g., INCONEL®)), which are well-adhered, wear-resistant, and thermally stable. These coatings can also be applied to additively manufactured (AM) parts such as turbine blades as protection against high-temperature (e.g., greater than 2,500° C.) erosion. The coatings adhere well to the substrate with negligible heat affected zone. No prior treatment or pre-treatment (e.g., polishing, heat-treatment, functionalization, pre-heating, or plasma treatment) of the substrate is required for enhancing coating deposition and adherence. The HE-UHTC shows excellent bonding irrespective of the substrate type (e.g., metals, alloys, and graphite). The coating can be deposited with precision control using a robotic system, and it can also be used for surface texturing on ceramic substrates like conventional UHTCs to improve their solar absorbance properties.

Figure 1B:
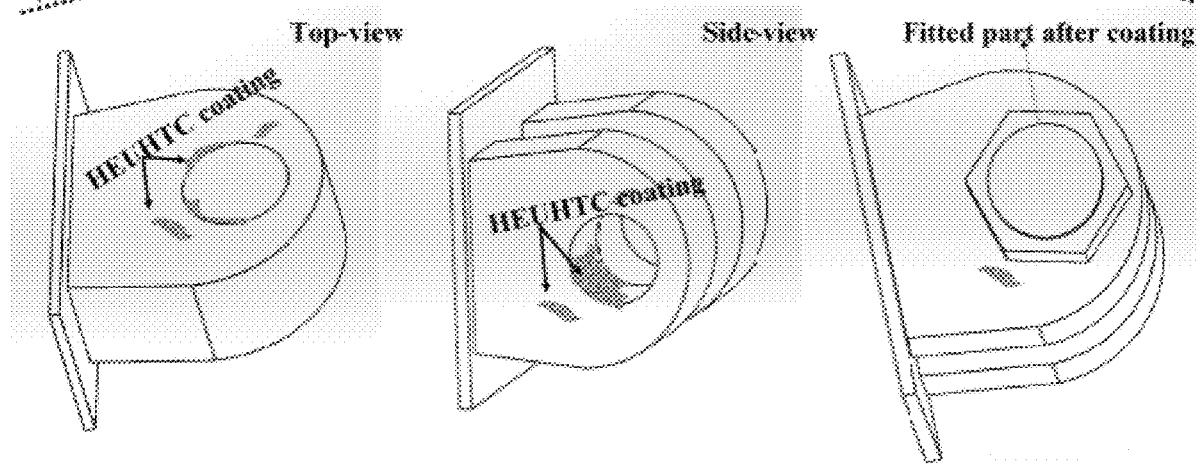
FIG. 1(b) shows image of HE-UHTC coatings along the shrouded inner-side of turbine blades with irregular geometry. From left to right are a top view, a side view, and a view of the fitted part after coating. The scale bar is 10 mm.

Embodiments of the subject invention have many advantages over related art coatings, including: no pre-treatment of the substrate (e.g., polishing, heat-treatment, functionalization, pre-heating, or plasma treatment) is required; the coatings are applicable to any electrically conductive substrate (see also FIGS. 1(a) and 1(b)); the coatings show good chemical compatibility and adherence on the substrate (see also FIGS. 5(a), 5(b), 6(a), 6(b), 8(a), and 8(b)); and no oxide phase is present in the coating (see also FIGS. 2(a), 2(b), 3, and 4).

Embodiments of the subject invention provide HE-UHTC coatings on metallic and graphite substrates (see, e.g., FIGS. 1(a) and 1(b)), including on substrates with irregular geometries (see, e.g., FIG. 1(b)). No phase transformation or oxidation is present in the HE-UHTC coating region, leading to thermal stability of the coatings up to its melting temperature (e.g., about 3,000° C. or higher; see also, e.g., FIGS. 2(a), 2(b), 3, and 4). The deposition can be precision controllable, automated, layer-by-layer deposition (see also, FIGS. 5(a), 5(b), 6(a), 6(b), 7(a), and 7(b)). The thickness of the HE-UHTC coating can be in a range of from, for example less than 1 μm (e.g., 0.1 μm) to 25 μm or more (e.g., 30 μm). Strong bonding is present between the substrate and the HE-UHTC coatings (see also, e.g., FIG. 6(b)), and the HE-UHTC coatings can be ultra-hard and wear-resistant (see also, e.g., FIGS. 8(a), 8(b), and 9). Embodiments of the subject invention can allow for surface texturing/patterning on various substrates, including UHTCs, HE-UHTCs, and MAX® (see engraved texts "PFL" with HE-UHTC" in FIG. 1(a) and "FIU" with MAX® in FIG. 10(a)) in a precise manner (e.g., to tailor the solar absorption properties). The fabrication process is applicable to other electrically conductive ceramics, including for example monolithic UHTCs and intermetallic carbides (e.g., MAX® carbide) (see, e.g., FIGS. 5(b), 10(a), 10(b), 11, and 12).

Coatings of embodiments of the subject invention (e.g., HE-UHTC coatings) can be used in various engineering applications, including in the energy, automotive, and aerospace sectors. For example, HE-UHTC (and other ceramic) coatings can be used: in turbine applications (e.g., on ablative seals and/or complex components to provide corrosion and erosion protection in severe environments such as hot/corrosive gas and sand erosion in military turbines); on agricultural tools (e.g., on subsurface harvesting and/or cutter blades); in the nuclear industry (e.g., on nuclear graphite for high-temperature reactors (HTRs) and/or as burnable neutron absorber coatings); in the automotive industry (e.g., on valves (e.g., Ti valves) for racing engines); in aero-engines; as high-temperature thermal insulation; as high-temperature solar absorption and/or receivers; in concentrated solar power (CSP) applications; in thermo-electric conversion; and/or in a space propulsion system (e.g., hypersonic vehicles, thrust chambers, and/or rocket nozzles).

The transitional term "comprising," "comprises," or "comprise" is inclusive or open-ended and does not exclude additional, unrecited elements or method steps. By contrast, the transitional phrase "consisting of" excludes any element, step, or ingredient not specified in the claim. The phrases "consisting" or "consists essentially of" indicate that the claim encompasses embodiments containing the specified materials or steps and those that do not materially affect the basic and novel characteristic(s) of the claim. Use of the term "comprising" contemplates other embodiments that "consist" or "consisting essentially of" the recited component(s).

When ranges are used herein, such as for dose ranges, combinations and subcombinations of ranges (e.g., subranges within the disclosed range), specific embodiments therein are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration.

The following examples are illustrative of some of the methods, applications, embodiments, and variants of the present invention. They are, of course, not to be considered as limiting the invention. Numerous changes and modifications can be made with respect to embodiments of the invention.

Example 1

A HE-UHTC electrode was fabricated by ball-mill mixing raw powders of HfC, TiC, (TaNb)C to give (TaNbHfTi)C powder and then performing SPS on the (TaNbHfTi)C powder to give the HE-UHTC electrode. The device shown in FIGS. 7(a) and 7(b) was used to perform an electro-spark deposition process to deposit HE-UHTC coatings on steel, INCONEL® (austenitic nickel-chromium-based superalloy), Ti alloy (on a turbine blade), and graphite substrates. FIG. 1(a) shows images of the HE-UHTC coatings on the substrates, and FIG. 1(b) shows close-ups of the HE-UHTC coatings along the shrouded inner-side of turbine blades with irregular geometry.

Figure 2A:
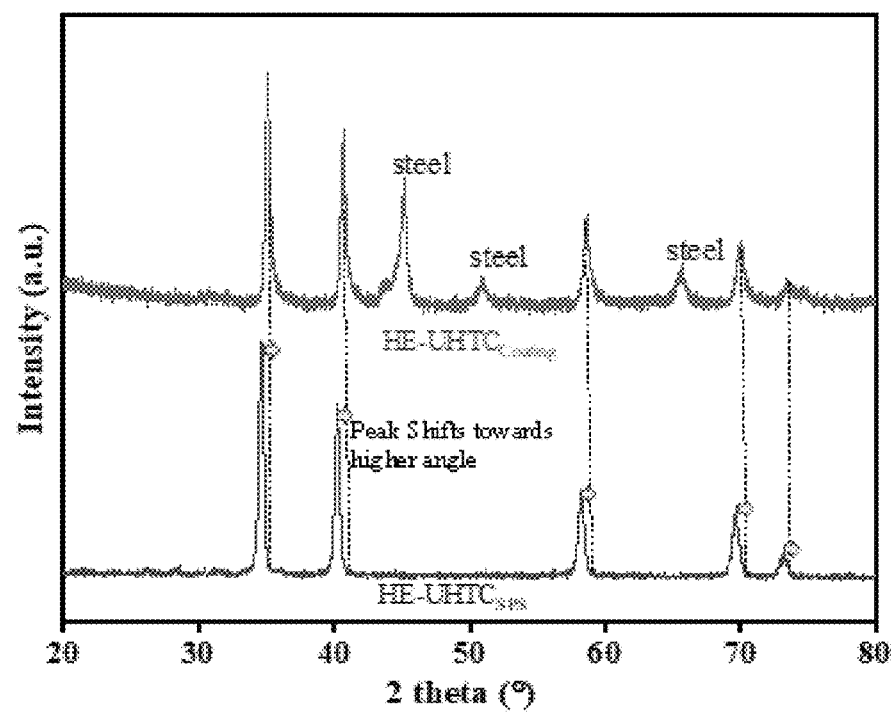
FIG. 2(a) shows a plot of intensity versus 2 theta (in degrees), showing an X-ray diffraction (XRD) for an HE-UHTC coating on a steel substrate. No phase transformation or oxidation occurred during the coating process.
Figure 2B:
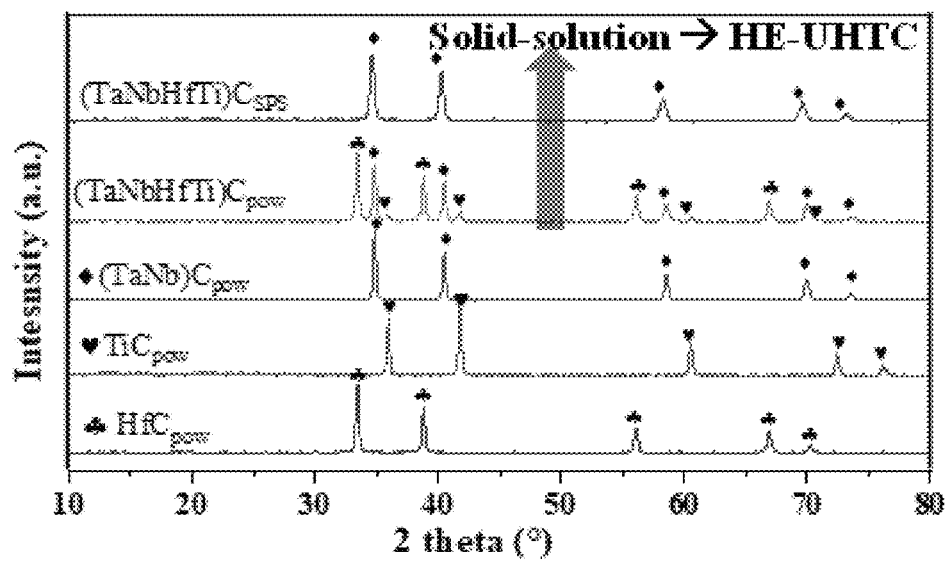
FIG. 2(b) shows a plot of intensity versus 2 theta (in degrees), showing XRD patterns for, from bottom curve to top curve, different raw powders (each with a "pow" subscript) of HfC, TiC, (TaNb)C, and (TaNbHfTi)C, and a spark plasma sintered (SPS) sample of (TaNbHfTi)C (subscript of "SPS").

FIG. 2(a) shows an X-ray diffraction (XRD) plot for the HE-UHTC coating on the steel substrate; no phase transformation or oxidation occurred during the coating process on the steel substrate. FIG. 2(b) shows XRD patterns for the raw powders (including the (TaNbHfTi)C powder) and the SPS electrode (subscript of "SPS").

Figure 3:
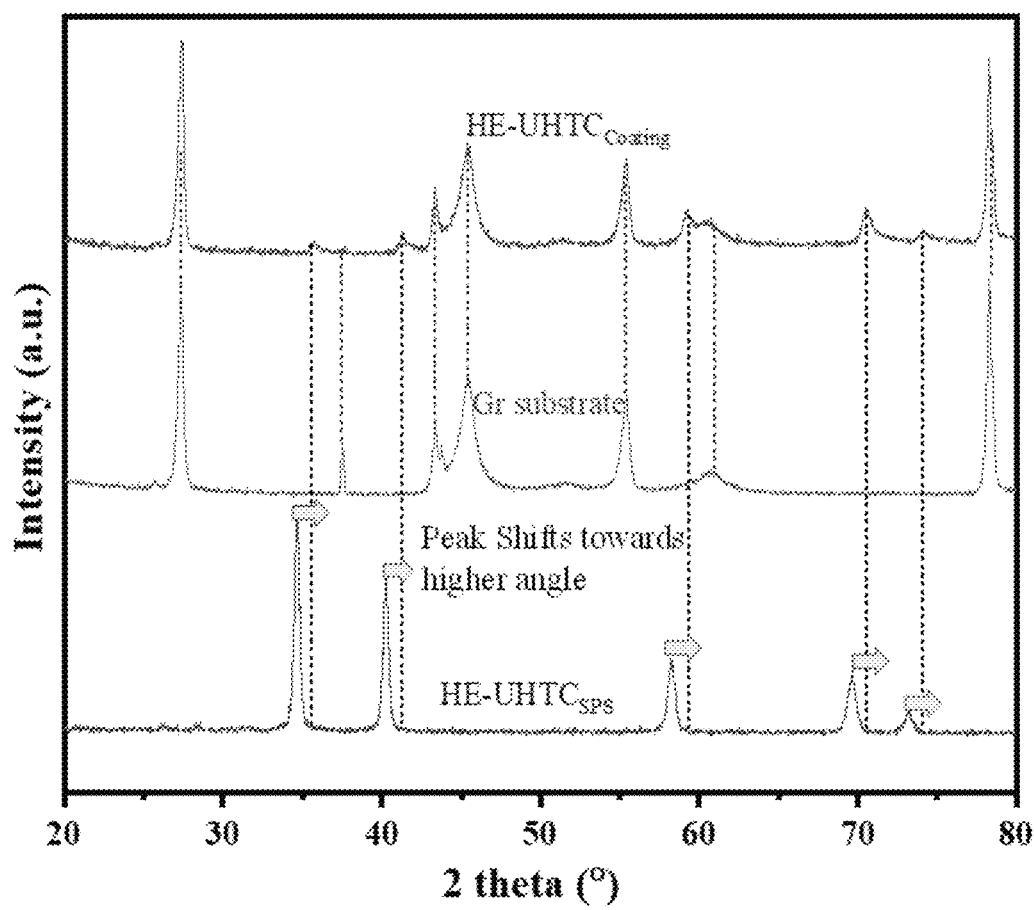
FIG. 3 shows a plot of intensity versus 2 theta (in degrees), showing XRD patterns for, from bottom curve to top curve, SPS HE-UHTC, a graphite substrate, and a HE-UHTC coating. No phase transformation or oxidation occurred during the coating process.

FIG. 3 shows XRD patterns for the SPS HE-UHTC electrode, the graphite substrate, and the HE-UHTC coating. No phase transformation or oxidation occurred during the coating process on the graphite substrate.

Figure 4:
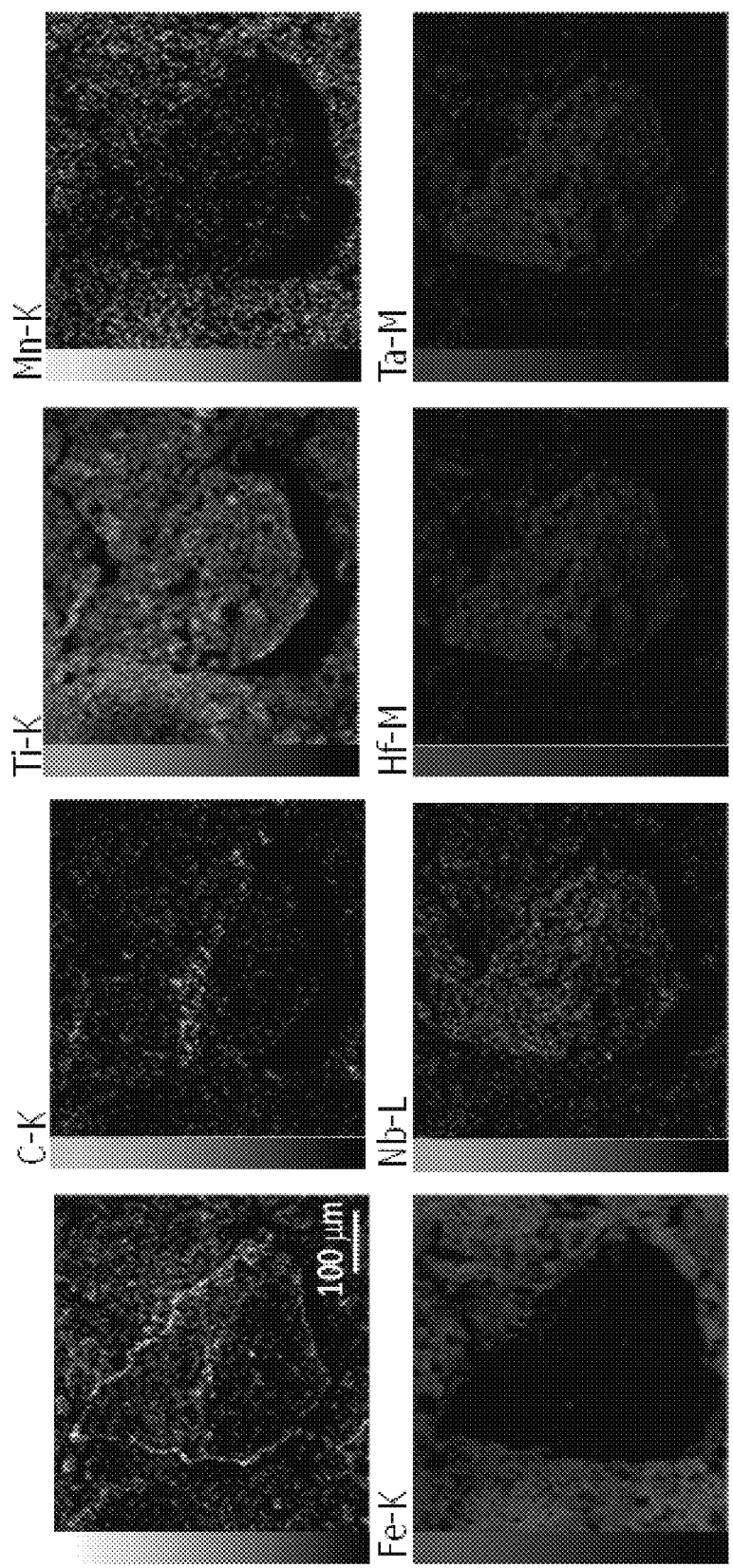
FIG. 4 shows energy-dispersive X-ray spectroscopy (EDS) images of an HE-UHTC coating on a steel substrate. The images, clockwise from top-left, show the selected coating area on the steel substrate, and then elemental mapping of C—K, Ti—K, Mn—K, Ta-M, Hf-M, Nb-L, and Fe—K showing the composition of the HE-UHTC coating on the steel substrate. Absence of any oxide phase is reconfirmed with these images. The scale bar is 100 micrometers (μm).

FIG. 4 shows DS images of the HE-UHTC coating on the steel substrate, as well as the elemental mapping (C—K, Ti—K, Mn—K, Ta-M, Hf-M, Nb-L, and Fe—K) showing the composition of the HE-UHTC coating on the steel substrate. Absence of any oxide phase is reconfirmed with these images.

Figures 5A, 5B:
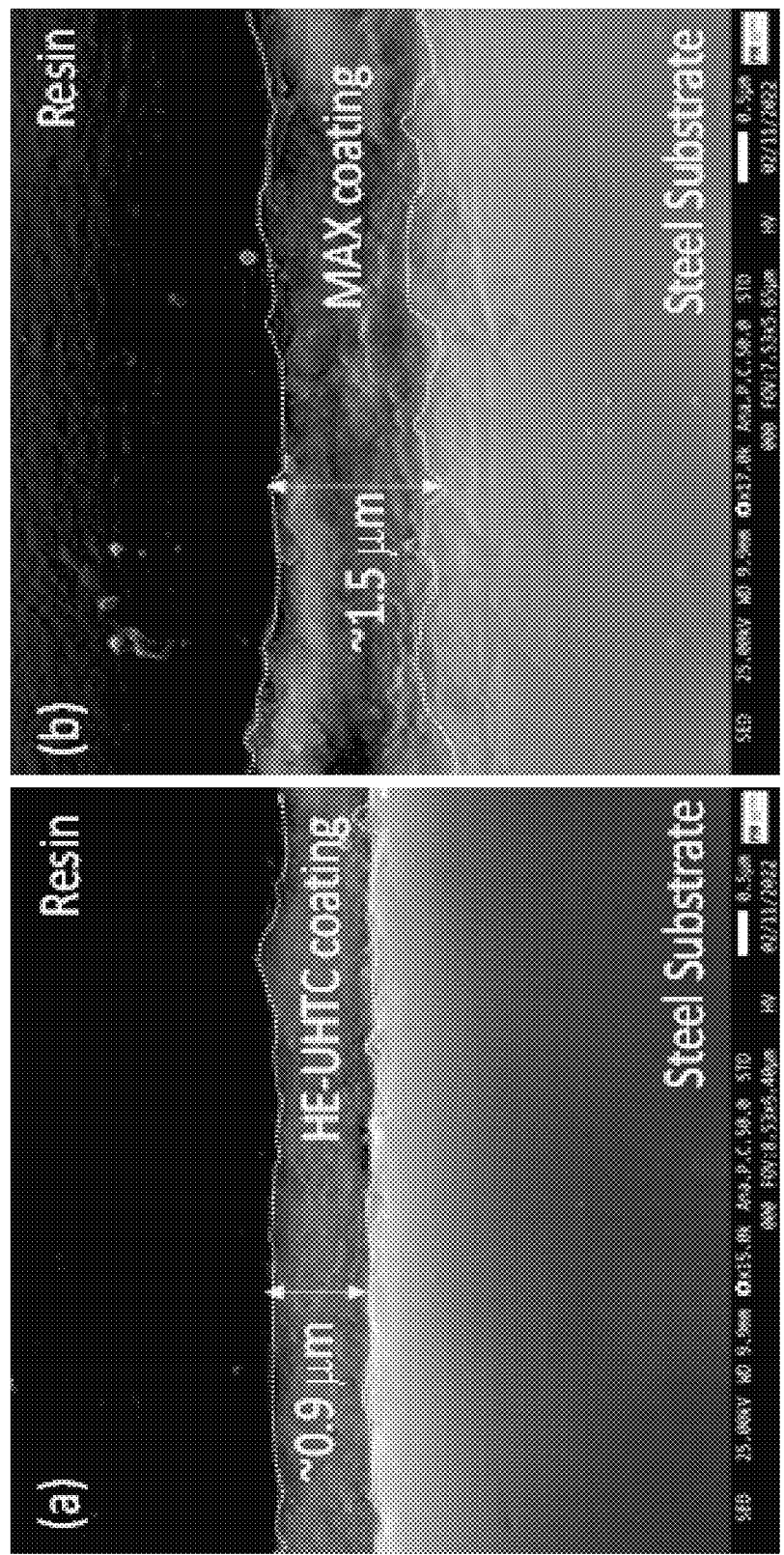
FIG. 5(a) shows a scanning electron microscope (SEM) image of a cross-section of an HE-UHTC coating on a steel substrate. The HE-UHTC coating is ultra-thin and crack-free. The scale bar is 0.5 μm.
FIG. 5(b) shows an SEM image of a cross-section of a MAX® (carbide) coating on a steel substrate. The MAX® coating is ultra-thin and crack-free. The scale bar is 0.5 μm.

FIG. 5(a) shows a scanning electron microscope (SEM) image of a cross-section of the HE-UHTC coating on the steel substrate. The HE-UHTC coating was ultra-thin and crack-free.

Figures 6A, 6B:
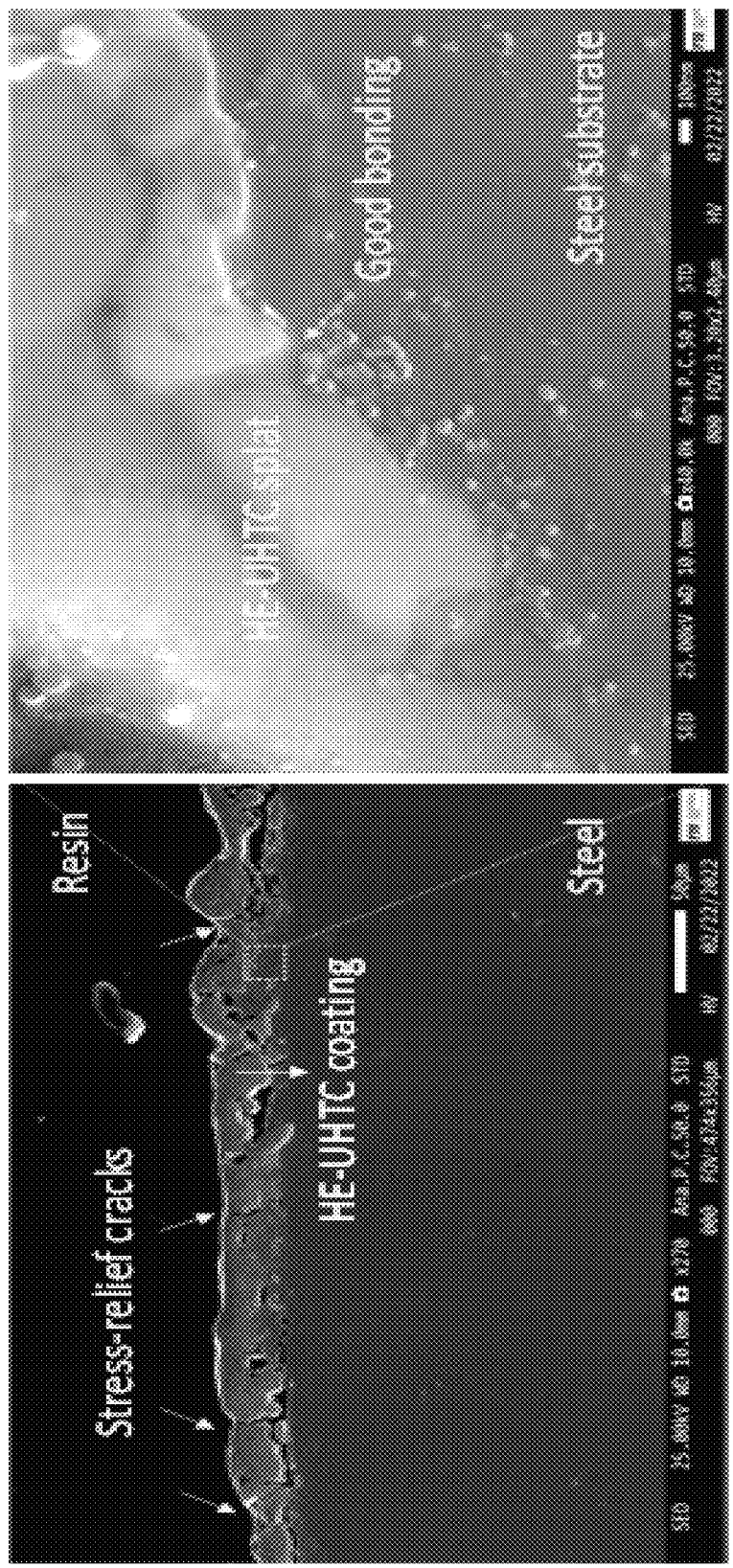
FIG. 6(a) shows an SEM image of a cross-section of an HE-UHTC coating on a steel substrate. This HE-UHTC coating is thicker than that shown in FIG. 5(a). The scale bar is 50 μm. The stress-relief cracking in the HE-UHTC coating is due to its increased thickness. This occurs due to volume change in the rapid solidification of the melted HE-UHTC during deposition. An optimization of the applied power and speed of the rotating applicator can eliminate the stress-relief cracking in the HE-UHTC coating. Though, even the stress-relief cracking in the HE-UHTC coating show outstanding wear performance (see also FIG. 9).
FIG. 6(b) shows an SEM image of a cross-section of the HE-UHTC coating on the steel substrate from FIG. 6(a). The image shows good bonding of the HE-UHTC coating with the steel substrate. The scale bar is 100 μm.

FIGS. 6(a) and 6(b) show SEM images of a cross-section of a thicker HE-UHTC coating on the steel substrate. The stress-relief cracking in the HE-UHTC coating is due to its increased thickness. This occurs due to volume change in the rapid solidification of the melted HE-UHTC during deposition. An optimization of the applied power and speed of the rotating applicator can eliminate the stress-relief cracking in the HE-UHTC coating. Though, even the stress-relief cracking in the HE-UHTC coating show outstanding wear performance (see also FIG. 9).

Figures 8A, 8B:
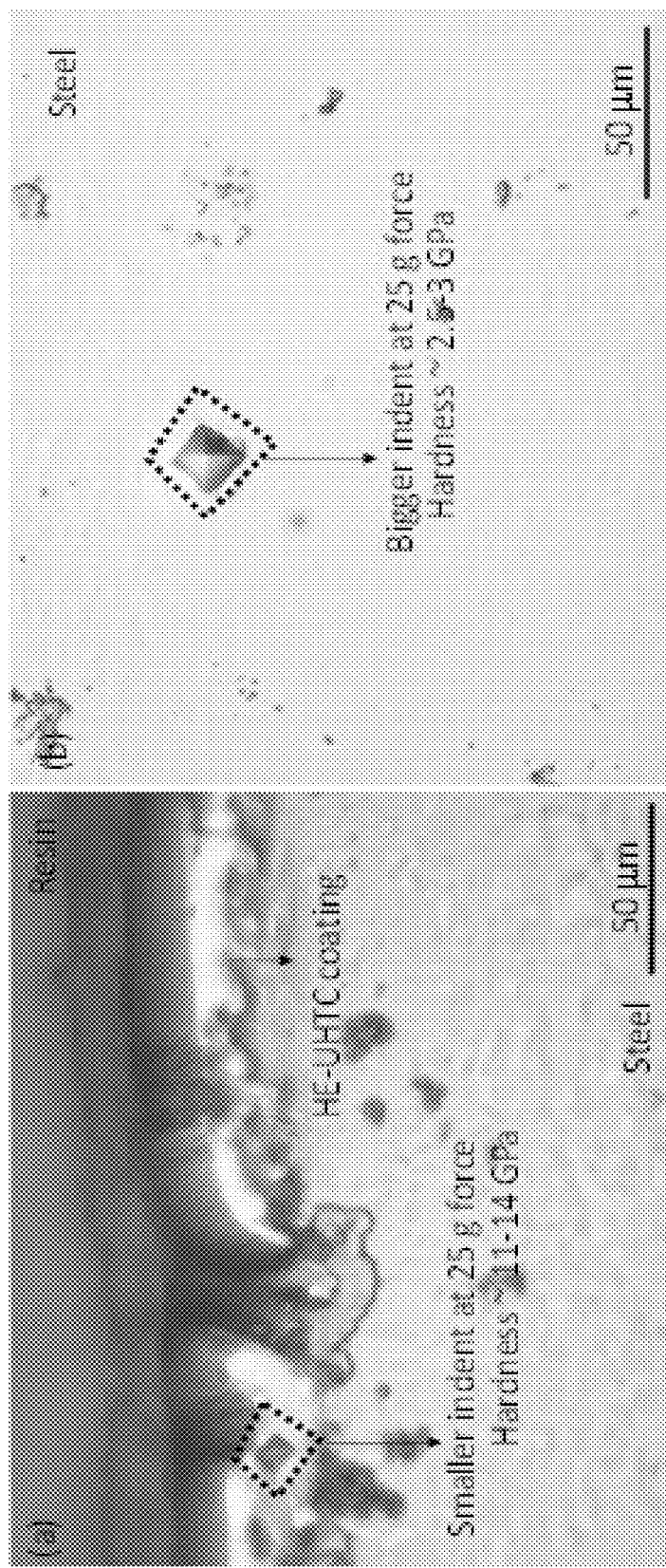
FIG. 8(a) shows an optical image of a Vickers' indent at 25 g force (g=9.8 meters per second squared (m/s$^2$)) on an HE-UHTC coating (hardness of 11 gigaPascals (GPa) to 14 GPa). The scale bar is 50 μm.
FIG. 8(b) shows an optical image of a Vickers' indent at 25 g force on a steel substrate (hardness of 2.5 GPa-3 GPa. The scale bar is 50 μm. Considered together with FIG. 8(a), it can be seen that hardness improved over 4.5 times with the HE-UHTC coating (even at a coating thickness of about 25 μm).

FIG. 8(a) shows an optical image of a Vickers' indent at 25 g force (g=9.8 meters per second squared (m/s$^2$)) on the HE-UHTC coating (hardness of 11 gigaPascals (GPa) to 14 GPa), and FIG. 8(b) shows an optical image of a Vickers' indent at 25 g force on the steel substrate (hardness of 2.5 GPa-3 GPa). Hardness improved over 4.5 times with the HE-UHTC coating (even at a coating thickness of about 25 μm) compared to the steel substrate alone.

Figure 9:
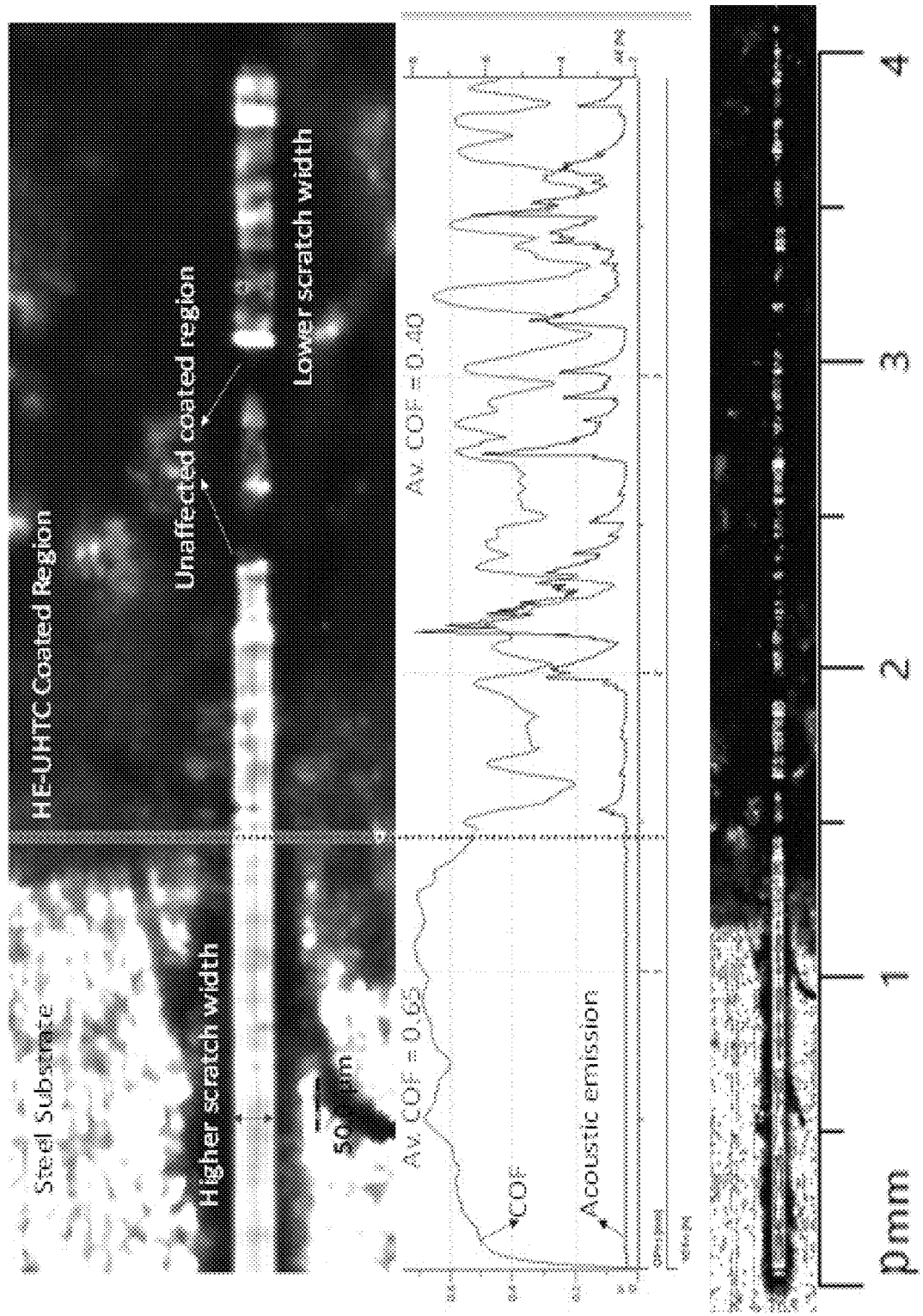
FIG. 9 shows an optical image (upper portion of figure; scale bar is 50 μm) of scratch testing that was performed to test wear resistance of an HE-UHTC coating at a constant load of 10 Newtons (N) and scratch length of 4 mm, along with coefficient of friction (COF) and acoustic emission (AE) data (middle portion of figure). The lower portion of the figure shows an optical micrograph of the overall scratch showing less damage on the HE-UHTC side than the steel substrate at a constant load of 10 N. The HE-UHTC coated region has a lower COF (0.40) than the steel substrate (0.65), which is an indication of an escalation in the tolerance towards wear damage.

FIG. 9 shows an optical image of scratch testing that was performed to test wear resistance of the HE-UHTC coating at a constant load of 10 Newtons (N) and scratch length of 4 mm, along with COF and acoustic emission (AE) data. An optical micrograph of the overall scratch shows less damage on the HE-UHTC side than the steel substrate at a constant load of 10 N. The HE-UHTC coated region has a lower COF (0.40) than the steel substrate (0.65), which is an indication of an escalation in the tolerance towards wear damage.

Example 2

A electrode was fabricated by performing SPS on a MAX® intermetallic carbide (phase Ti$_2$AlC) to give a Ti$_2$AlC electrode. The device shown in FIGS. 7(a) and 7(b) was used to perform an electro-spark deposition process to deposit MAX® coatings on steel and INCONEL® substrates.

Figures 10A, 10B:
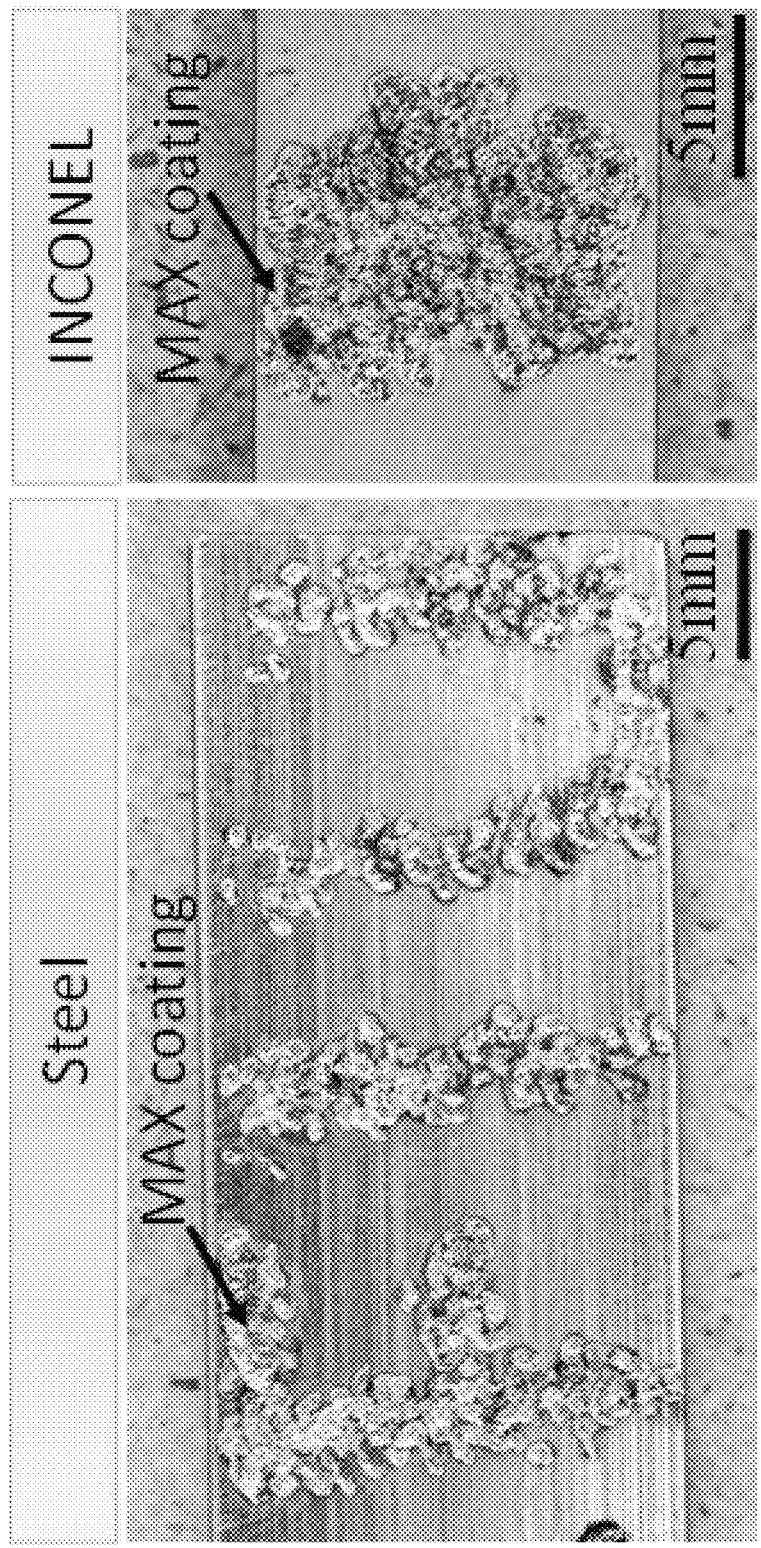
FIG. 10(a) shows an image of a MAX® coating on a steel substrate. The scale bar is 5 mm.
FIG. 10(b) shows an image of a MAX® coating on an INCONEL® substrate. The scale bar is 5 mm.
Figure 11:
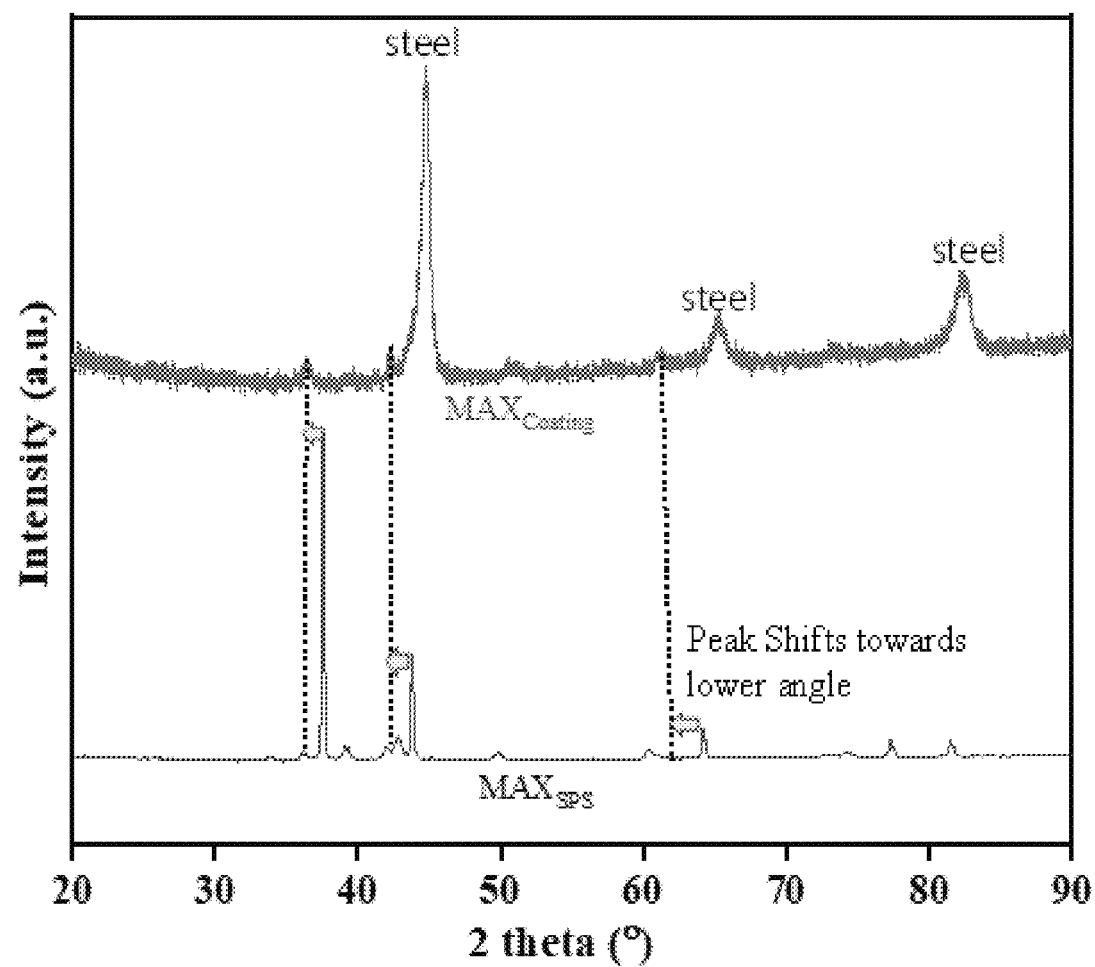
FIG. 11 shows a plot of intensity versus 2 theta (in degrees), showing an XRD pattern for a MAX® coating on a steel substrate. No phase transformation or oxidation occurred during the coating process.
Figure 12:
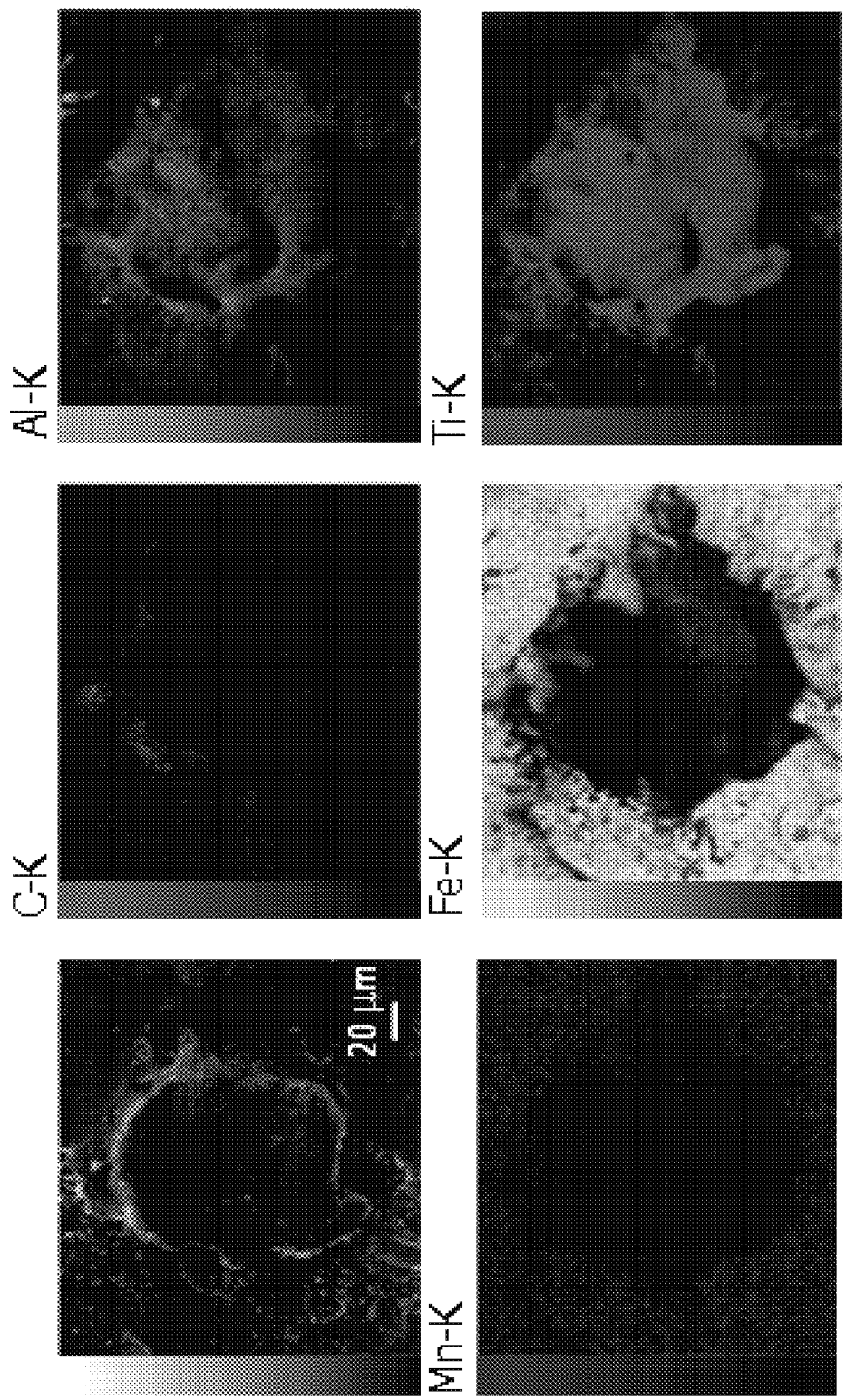
FIG. 12 shows EDS images of a MAX® coating on a steel substrate. The images, clockwise from top-left, show the selected coating area on the steel substrate, and then elemental mapping of C—K, Al—K, Ti—K, Fe—K, and Mn—K showing the composition of the MAX® coating on the steel substrate. The scale bar is 20 μm.

FIG. 10(a) shows an image of the MAX® coating on a steel substrate, and FIG. 10(b) shows an image of the MAX® coating on the INCONEL® substrate. FIG. 11 shows the XRD pattern for the MAX® coating on the steel substrate. No phase transformation or oxidation occurred during the coating process. FIG. 12 shows EDS images of the MAX® coating on the steel substrate, as well as the elemental mapping (C—K, Al—K, Ti—K, Fe—K, and Mn—K) showing the composition of the MAX® coating on the steel substrate. Absence of any oxide phase is reconfirmed with these images.

FIG. 5(b) shows an SEM image of a cross-section of the MAX® coating on the steel substrate. The MAX® coating is ultra-thin and crack-free.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A method for fabricating a coating of a ceramic material on a substrate, the method comprising:
    performing a spark plasma sintering (SPS) process on a powder of the ceramic material to give an electrode; and
    depositing the coating of the ceramic material on the substrate by performing an electro-spark deposition process using the electrode.

2. The method according to claim 1, the ceramic material being a high-entropy ultra-high temperature ceramic (HE-UHTC).

3. The method according to claim 1, the substrate being an electrically conductive substrate.

4. The method according to claim 1, the substrate being steel, graphite, a nickel-based alloy, or a titanium-based alloy.

5. The method according to claim 1, the ceramic material being an intermetallic carbide.

6. The method according to claim 1, further comprising, before performing the SPS process on the powder of the ceramic material:
    preparing the powder of the ceramic material by ball-milling raw powders of a plurality of ceramic components.

7. The method according to claim 6, the ceramic material being an HE-UHTC,
    each ceramic component of the plurality of ceramic components being an ultra-high temperature ceramic (UHTC), and
    the preparing of the powder of the ceramic material comprising ball-milling the raw powders such that the powder of the ceramic material comprises an equimolar composition of the UHTCs.

8. The method according to claim 1, the depositing of the coating of the ceramic material comprising precision controllable, automated, layer-by-layer deposition of the ceramic material.

9. The method according to claim 1, the coating of the ceramic material on the substrate having a thickness in a range of from 0.1 micrometers (km) to 30 km.

10. The method according to claim 1, the substrate having no pre-treatment performed thereon before the depositing of the coating of the ceramic material on the substrate.

11. The method according to claim 1, the coating of the ceramic material on the substrate comprising no oxidation or phase transformation.

12. The method according to claim 1, the coating of the ceramic material on the substrate being thermally stable up to a temperature of at least 2,500° C.

13. A compound, comprising:
an electrically conductive substrate; and
a coating of a high-entropy ultra-high temperature ceramic (HE-UHTC) disposed directly on and in physical contact with the substrate,
the coating of the HE-UHTC being thermally stable up to a temperature of at least 2,500° C.

14. The compound according to claim 13, the substrate being steel, graphite, a nickel-based alloy, or a titanium-based alloy.

15. The compound according to claim 13, the HE-UHTC comprising an equimolar composition of at least two ultra-high temperature ceramics (UHTCs).

16. The compound according to claim 13, the coating of the HE-UHTC having a thickness in a range of from 0.1 micrometers (μm) to 30 μm.

17. The compound according to claim 13, the coating of the HE-UHTC comprising no oxidation or phase transformation.

18. A method for fabricating a coating of a high-entropy ultra-high temperature ceramic (HE-UHTC) on a substrate, the method comprising:
preparing a powder of the HE-UHTC by ball-milling raw powders of a plurality of ultra-high temperature ceramics (UHTCs);
performing a spark plasma sintering (SPS) process on the powder of the HE-UHTC to give an electrode; and
depositing the coating of the HE-UHTC on the substrate by performing an electro-spark deposition process using the electrode,
the substrate being steel, graphite, a nickel-based alloy, or a titanium-based alloy,
the preparing of the powder of the HE-UHTC comprising ball-milling the raw powders such that the powder of the HE-UHTC comprises an equimolar composition of the UHTCs,
the depositing of the coating of the ceramic material comprising precision controllable, automated, layer-by-layer deposition of the HE-UHTC,
the coating of the HE-UHTC on the substrate having a thickness in a range of from 0.1 micrometers (μm) to 30 μm,
the substrate having no pre-treatment performed thereon before the depositing of the coating of the HE-UHTC on the substrate,
the coating of the HE-UHTC on the substrate comprising no oxidation or phase transformation, and
the coating of the HE-UHTC on the substrate being thermally stable up to a temperature of at least 2,500° C.

19. The method according to claim 18, the HE-UHTC being (TaNbHfTi)C.

* * * * *